United States Patent
Yim et al.

(10) Patent No.: US 10,199,325 B2
(45) Date of Patent: Feb. 5, 2019

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Taejin Yim, Yongin-si (KR); Jongmin Baek, Seoul (KR); Deokyoung Jung, Seoul (KR); Kyuhee Han, Hwaseong-si (KR); Byunghee Kim, Seoul (KR); Jiyoung Kim, Seoul (KR); Naein Lee, Seoul (KR); Sangshin Jang, Gwangyang-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/792,911

(22) Filed: Oct. 25, 2017

(65) Prior Publication Data
US 2018/0151490 A1    May 31, 2018

(30) Foreign Application Priority Data

Nov. 28, 2016 (KR) .................... 10-2016-0159567

(51) Int. Cl.

| H01L 23/48 | (2006.01) |
|---|---|
| H01L 23/52 | (2006.01) |
| H01L 29/40 | (2006.01) |
| H01L 23/522 | (2006.01) |
| H01L 23/532 | (2006.01) |
| H01L 21/768 | (2006.01) |

(52) U.S. Cl.
CPC ...... *H01L 23/5222* (2013.01); *H01L 21/7682* (2013.01); *H01L 21/76802* (2013.01); *H01L 21/76831* (2013.01); *H01L 21/76843* (2013.01); *H01L 23/5226* (2013.01); *H01L 23/5228* (2013.01); *H01L 23/53238* (2013.01); *H01L 23/53295* (2013.01)

(58) Field of Classification Search
CPC .......... H01L 21/7682; H01L 21/76802; H01L 21/76877; H01L 23/53295; H01L 23/5226
See application file for complete search history.

(56) References Cited

U.S. PATENT DOCUMENTS

| 5,858,869 A | 1/1999 | Chen et al. |
| 5,880,026 A | 3/1999 | Xing et al. |

(Continued)

FOREIGN PATENT DOCUMENTS

KR    10-0596749 B1    7/2002

*Primary Examiner* — Jaehwan Oh
*Assistant Examiner* — John M Parker
(74) *Attorney, Agent, or Firm* — Lee & Morse, P.C.

(57) ABSTRACT

A semiconductor device is provided. The semiconductor device includes first metal lines on a lower layer, a dielectric barrier layer provided on the lower layer to cover side and top surfaces of the first metal lines, an etch stop layer provided on the dielectric barrier layer to define gap regions between the first metal lines, an upper insulating layer on the etch stop layer, and a conductive via penetrating the upper insulating layer, the etch stop layer, and the dielectric barrier layer to contact a top surface of a first metal line. The etch stop layer includes first portions on the first metal lines and second portions between the first metal lines. The second portions of the etch stop layer are higher than the first portions.

20 Claims, 14 Drawing Sheets

(56) References Cited

U.S. PATENT DOCUMENTS

| | | | |
|---|---|---|---|
| 6,187,672 B1 | 2/2001 | Zhao et al. | |
| 6,559,045 B2 | 5/2003 | Chung | |
| 6,583,043 B2 | 6/2003 | Shroff et al. | |
| 7,002,252 B2 | 2/2006 | Yamamoto | |
| 7,253,105 B2 | 8/2007 | Dimitrakopoulos et al. | |
| 7,629,264 B2 | 12/2009 | Bonilla et al. | |
| 7,635,646 B2* | 12/2009 | Omoto | H01L 21/7682 257/E21.479 |
| 7,741,228 B2* | 6/2010 | Ueki | H01L 21/7682 257/E21.573 |
| 8,404,582 B2 | 3/2013 | Horak et al. | |
| 8,779,590 B2* | 7/2014 | Isobayashi | H01L 23/4821 257/751 |
| 9,305,836 B1* | 4/2016 | Gates | H01L 21/28556 |
| 9,324,650 B2 | 4/2016 | Edelstein et al. | |
| 9,396,989 B2 | 7/2016 | Purayath et al. | |
| 9,711,455 B2* | 7/2017 | Gates | H01L 23/53238 |
| 2003/0116439 A1 | 6/2003 | Seo et al. | |
| 2008/0169565 A1* | 7/2008 | Bonilla | H01L 21/7682 257/761 |
| 2010/0093168 A1* | 4/2010 | Naik | H01L 21/31144 438/618 |
| 2010/0130001 A1* | 5/2010 | Noguchi | H01L 21/76811 438/627 |
| 2012/0261828 A1* | 10/2012 | Bruce | H01L 23/5222 257/774 |
| 2013/0207269 A1* | 8/2013 | Oshida | H01L 21/31116 257/762 |
| 2016/0181144 A1* | 6/2016 | Nitta | G01H 11/06 438/618 |
| 2018/0033691 A1* | 2/2018 | You | H01L 21/76883 |

\* cited by examiner

SEMICONDUCTOR DEVICE AND METHOD OF FABRICATING THE SAME

CROSS-REFERENCE TO RELATED APPLICATIONS

Korean Patent Application No. 10-2016-0159567, filed on Nov. 28, 2016, in the Korean Intellectual Property Office, and entitled: "Semiconductor Device and Method of Fabricating the Same," is incorporated by reference herein in its entirety.

BACKGROUND

1. Field

The present disclosure relates to a semiconductor device and a method of fabricating the same, and in particular, to semiconductor devices with metal lines and methods of fabricating the same.

2. Description of the Related Art

With the advance of integrated circuit (IC) technologies, there is an increasing demand for highly-integrated, high performance semiconductor devices. To meet such a demand, a critical dimension (CD) of a semiconductor device has been reduced. However, the reduction in CD of a semiconductor device leads to an increase in electrical resistance or capacitive coupling of interconnection lines which results in a difficulty in realizing a high-speed semiconductor device.

SUMMARY

According to some embodiments, a semiconductor device may include first metal lines provided on a lower layer, a dielectric barrier layer provided on the lower layer to cover side and top surfaces of the first metal lines, an etch stop layer provided on the dielectric barrier layer to define gap regions between the first metal lines, an upper insulating layer provided on the etch stop layer, and a conductive via provided to penetrate the upper insulating layer, the etch stop layer, and the dielectric barrier layer to be in contact with a top surface of a first metal line. The etch stop layer may include first portions on the top surfaces of the first metal lines and second portions between the first metal lines. The second portions of the etch stop layer may be located at a level higher than that of the first portions.

According to some embodiments, a semiconductor device may include first metal lines provided on a lower layer, low-k dielectric patterns provided to fill gap regions between the first metal lines and to have top surfaces located at a level higher than top surfaces of the first metal lines, buffer patterns provided between the first metal lines and between bottom surfaces of the low-k dielectric patterns and the lower layer, the buffer patterns being formed of an insulating material different from the low-k dielectric patterns, an etch stop layer provided to cover the top surfaces of the first metal lines and the low-k dielectric patterns, an upper insulating layer provided on the etch stop layer, and a conductive via provided to penetrate the upper insulating layer and the etch stop layer and be in contact with a top surface of a first metal line.

According to some embodiments, a method of fabricating a semiconductor device may include forming first metal lines to be spaced apart from each other on a lower layer, depositing a buffer layer on the first metal lines, a deposition thickness of the buffer layer on top surfaces of the first metal lines being larger than that on side surfaces of the first metal lines, forming low-k dielectric patterns on the buffer layer to fill spaces between the first metal lines, the low-k dielectric patterns having top surfaces located at a level higher than that of the top surfaces of the first metal lines, removing upper portions of the buffer layer from the top surfaces of the first metal lines to expose side surfaces of the low-k dielectric patterns, forming an etch stop layer to cover the top surfaces of the first metal lines and the exposed side and top surfaces of the low-k dielectric patterns, forming an upper insulating layer on the etch stop layer, and forming a conductive via to penetrate the upper insulating layer and the etch stop layer and be in contact with a top surfaces of a first metal line.

According to some embodiments, a semiconductor device may include first metal lines on a lower layer that extend in a first direction and are spaced apart along a second direction, different from the first direction, a dielectric barrier layer on the lower layer to cover side and top surfaces of the first metal lines, an etch stop layer on the dielectric barrier layer to define gap regions between the first metal lines, the etch stop layer including first portions on the top surfaces of the first metal lines and second portions between the first metal lines that extend from the first portions along the first direction away from the lower layer, an upper insulating layer on the etch stop layer; and a conductive via that penetrates the upper insulating layer, the etch stop layer, and the dielectric barrier layer to contact a top surfaces of a first metal line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
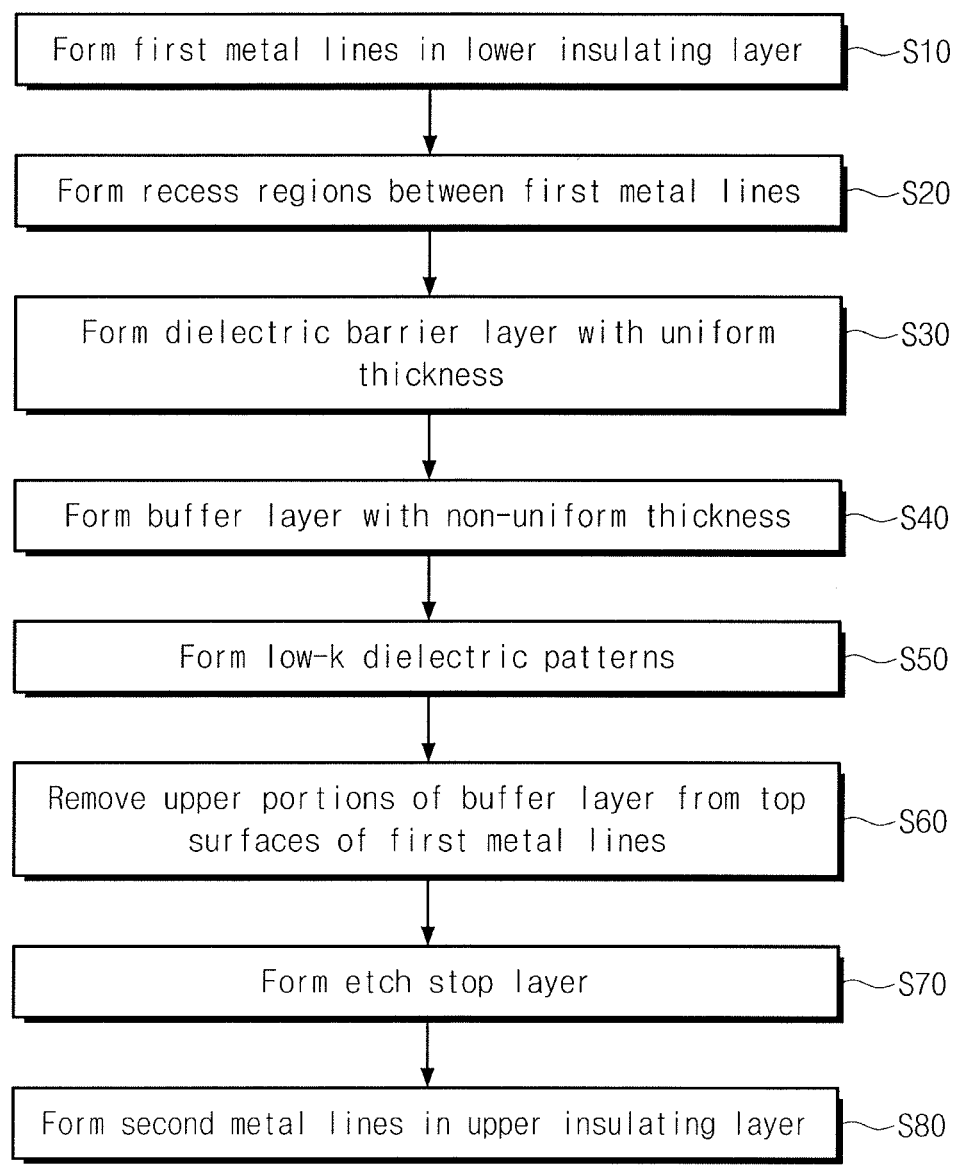
FIG. 1 illustrates a flow chart of a method of fabricating a semiconductor device, according to some embodiments.

FIG. 1 is a flow chart illustrating a method of fabricating a semiconductor device, according to some embodiments. FIGS. 2A to 2H are sectional views illustrating stages in a method of fabricating a semiconductor device, according to some embodiments. FIGS. 3A and 3B are enlarged sectional views of a portion 'A' of FIG. 2H.

Figure 2A:
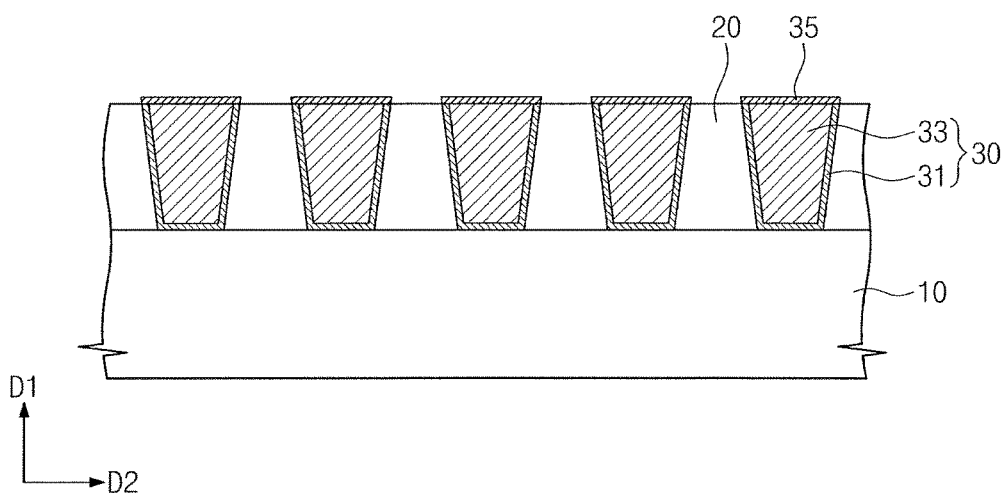
FIGS. 2A to 2H illustrate sectional views of stages in a method of fabricating a semiconductor device, according to some embodiments.
Figure 3A:
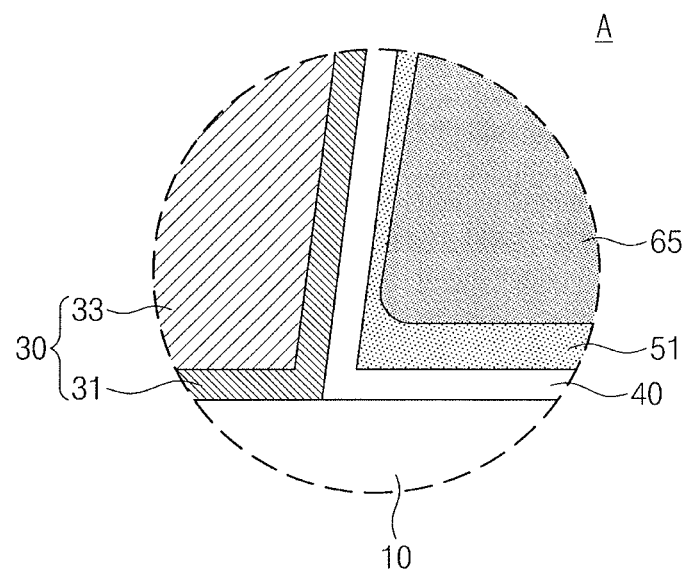
FIGS. 3A and 3B illustrate enlarged sectional views of a portion 'A' of FIG. 2H.
Figure 3B:
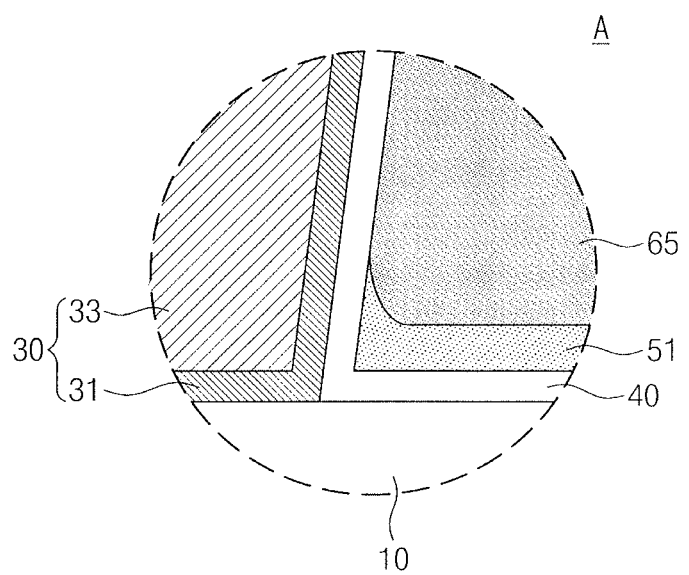

Referring to FIGS. 1 and 2A, first metal lines 30 may be formed in a lower insulating layer 20 (in S10). The lower insulating layer 20 may be formed on a lower layer 10, in which semiconductor devices (not shown) are formed. The lower layer 10 may include conductive patterns and insulating layers. For example, the lower layer 10 may include MOS transistors, capacitors, resistors, contact plugs, and interconnection lines. The lower insulating layer 20 may be a silicon oxide layer, which is formed of at least one of, for example, high density plasma (HDP) oxide, tetraethylorthosilicate (TEOS), plasma-enhanced TEOS (PE-TEOS), ozone (O3)-TEOS, undoped silicate glass (USG), phosphosilicate glass (PSG), borosilicate glass (BSG), borophosphosilicate glass (BPSG), fluoride silicate glass (FSG), spin-on-glass (SOG), tonen silazene (TOSZ), or any combination thereof.

The lower insulating layer 20 may be patterned to form trenches extending in a first direction D1 and spaced apart along a second direction D2. The first metal lines 30 may be formed in the trenches. The first metal lines 30 may be electrically connected to the conductive patterns the lower layer 10. Each of the first metal lines 30 may include a barrier metal layer 31 and a metal layer 33, which are sequentially stacked on the lower layer 10.

For example, the formation of the first metal lines 30 may include sequentially forming the barrier metal layer 31 and the metal layer 33 on the lower insulating layer 20 with the trenches and then planarizing the barrier metal layer 31 and the metal layer 33 to expose a top surface of the lower insulating layer 20.

The barrier metal layer 31 may be formed to conformally cover inner surfaces of the trenches, and the metal layer 33 may be formed to fill the trenches provided with the barrier metal layer 31. The barrier metal layer 31 may be formed of or include at least one of, for example, tantalum (Ta), tantalum nitride (TaN), tantalum silicon nitride (TaSiN), titanium (Ti), titanium nitride (TiN), titanium silicon nitride (TiSiN), tungsten (W), or tungsten nitride (WN). The metal layer 33 may be formed of or include at least one of metal materials (e.g., tungsten (W), aluminum (Al), titanium (Ti), tantalum (Ta), cobalt (Co), and copper (Cu)). As an example, the metal layer 33 may be formed of or include copper or copper alloy, and here, the copper alloy may include copper-based materials, in which at least one of carbon (C), silver (Ag), Co, Ta, indium (In), tin (Sn), zinc (Zn), manganese (Mn), Ti, magnesium (Mg), chromium (Cr), germanium (Ge), strontium (Sr), platinum (Pt), Al, or ziroconium (Zr) is contained in a small amount.

After the formation of the first metal lines 30, a capping layer 35 may be formed on top surfaces of the first metal lines 30. The capping layer 35 may be formed of a material having an etch selectivity with respect to the lower insulating layer 20. For example, the capping layer 35 may be formed of at least one of metals (e.g., Ta, ruthenium (Ru), Co, Mn, Ti, W, nickel (Ni), and Al) or nitrides of the metals. In certain embodiments, the capping layer 35 may be formed of at least one of conductive materials (e.g., cobalt tungsten phosphide (CoWP), cobalt tin phosphide (CoSnP), cobalt phosphide (CoP), cobalt boride (CoB), cobalt tin boride (CoSnB), palladium (Pd), In, nickel boride (NiB), tantalum oxide (TaO) and titanium oxide (TiO)). In some embodiments, the capping layer 35 may include Co and/or aluminum nitride (AlN).

The capping layer 35 may be formed using one of chemical vapor deposition (CVD), selective CVD, atomic layer deposition (ALD), and electroless deposition (ELD) methods.

Figure 2B:
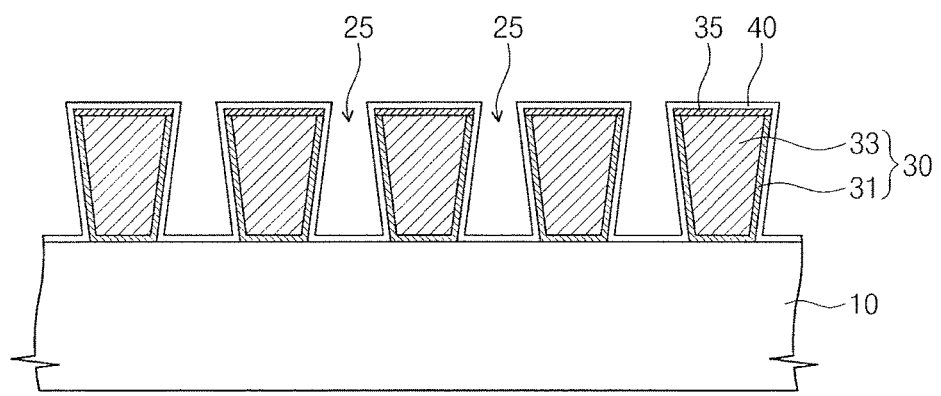

Referring to FIGS. 1 and 2B, the lower insulating layer 20 may be recessed to form recess regions 25 exposing the side surfaces of the first metal lines 30 (in S20).

As an example, the formation of the recess regions 25 may include anisotropically or isotropically etching the lower insulating layer 20 using an etch recipe having an etch selectivity with respect to the first metal lines 30. During the formation of the recess regions 25, metallic materials in the first metal lines 30 may be protected by the barrier metal layer 31 and the capping layer 35.

In some embodiments, the recess regions 25 may be formed to partially expose a top surface of the lower layer 10 between the first metal lines 30. In certain embodiments, a portion of the lower insulating layer 20 may remain between the first metal lines 30, after the formation of the recess regions 25.

Thereafter, a dielectric barrier layer 40 may be formed to conformally cover exposed surfaces of the first metal lines 30 (in S30). The dielectric barrier layer 40 may be formed of or include at least one of insulating materials (e.g., silicon nitride (SiN), silicon oxynitride (SiON), silicon carbide (SiC), silicon carbon nitride (SiCN), hydrogenated silicon oxycarbide (SiOCH), silicon oxycarbide (SiOC), and silicon oxyfluoride (SiOF)). The dielectric barrier layer 40 may be formed to have a single- or multi-layer structure. As an example, the dielectric barrier layer 40 may include at least one layer that is formed of at least one of AlN, SiOC, SiCN, or other Al-compounds.

The dielectric barrier layer 40 may be formed by a film-forming method having a good step-coverage or conformality property (for example, CVD or ALD). For example, the dielectric barrier layer 40 may have a substantially uniform thickness on the top surfaces of the first metal lines 30 and the side surfaces of the first metal lines 30.

Figure 2C:
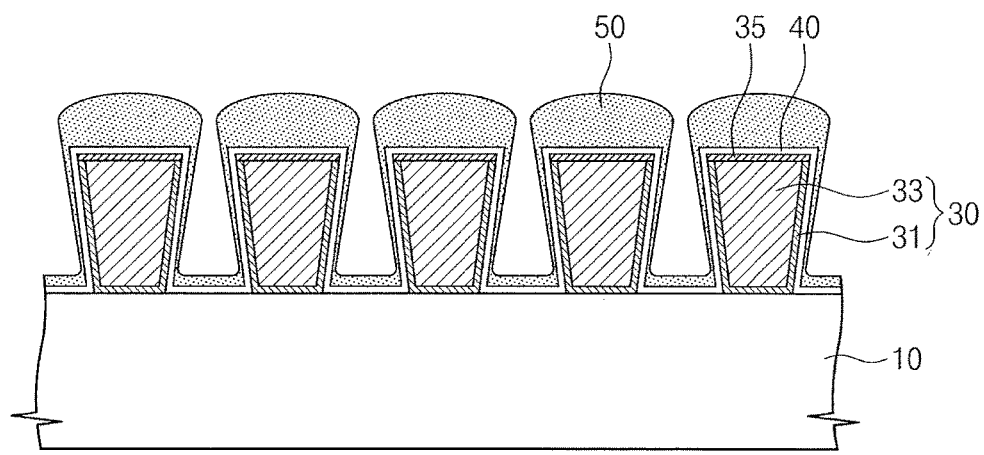

Referring to FIGS. 1 and 2C, a buffer layer 50 may be formed on the dielectric barrier layer 40 to have a non-conformal or non-uniform thickness (in S40). The buffer layer 50 may be formed by a film-forming method having a poor step-coverage or gap-fill property. For example, the buffer layer 50 may be formed by a plasma-enhanced chemical vapor deposition (PE-CVD) method, a high-density plasma (HDP) method, and a sputtering deposition method.

In some embodiments, the buffer layer 50 may be deposited on the first metal lines 30 using a PE-CVD method. By adjusting process conditions (e.g., temperature, pressure, and/or RF power) in the PE-CVD process, it may be possible to control the step-coverage property of the buffer layer 50. In some embodiments, a thickness of the buffer layer 50 may be greater on the top surfaces of the first metal lines 30 than on the side surfaces of the first metal lines 30. Accordingly, when the buffer layer 50 is deposited, entrances of the recess regions 25 between the first metal lines 30 may not be closed, e.g., completely closed, by the buffer layer 50.

As an example, a thickness of the buffer layer 50 on the top surfaces of the first metal lines 30 may be at least two times that on the side surfaces of the first metal lines 30. The buffer layer 50 may have a non-uniform thickness on the side surfaces of the first metal lines 30. The buffer layer 50 may also be deposited on bottom surfaces of the recess regions 25 between the first metal lines 30, and a deposition thickness of the buffer layer 50 between the first metal lines 30 may be smaller than that on the top surfaces of the first metal lines 30. Furthermore, the thickness of the buffer layer 50 may be smaller on the side surfaces of the first metal lines 30 than between the first metal lines 30.

The buffer layer 50 may be formed of an insulating material that is different from the dielectric barrier layer 40 or has an etch selectivity with respect to the dielectric barrier layer 40. As an example, the buffer layer 50 may be formed of or include at least one of insulating materials (e.g., SiN, SiON, SiC, SiCN, SiOCH, SiOC, and SiOF). As another example, the buffer layer 50 may be formed of or include a silicon oxide layer (e.g., high-density plasma (HDP) oxide or PE-TEOS).

Figure 2D:
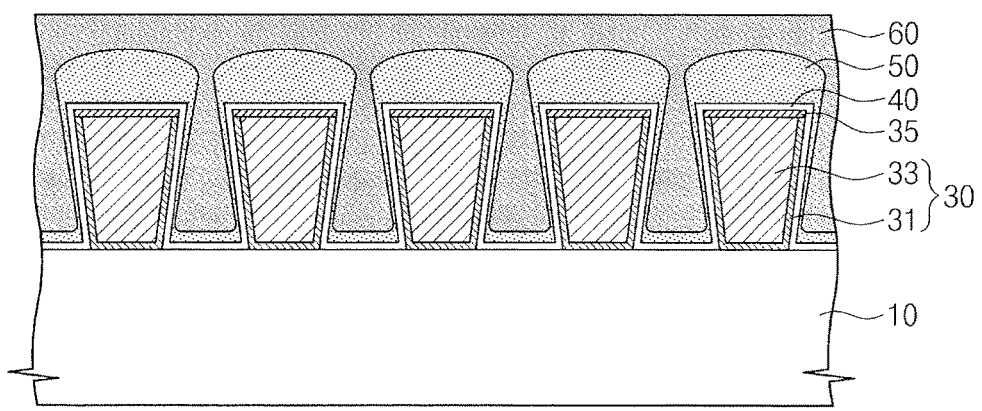

Referring to FIG. 2D, a low-k dielectric layer 60 may be formed on the buffer layer 50 to fill gap regions between the first metal lines 30. The low-k dielectric layer 60 may be formed of a dielectric material having an etch selectivity with respect to the buffer layer 50 and having a dielectric constant lower than that of silicon oxide. The low-k dielectric layer 60 may have a dielectric constant of about 1.0 to 3.0 and may include at least one of organic, inorganic, or organic-inorganic hybrid materials. The low-k dielectric layer 60 may have a porous or non-porous structure.

The low-k dielectric layer 60 may be formed of at least one of doped silicon oxide materials. For example, the low-k dielectric layer 60 may be formed of at least one of fluorine-doped oxide (or FSG), carbon doped oxide, silicon oxide, hydrogen silsesquioxane (HSQ; SiO:H), methyl silsesquioxane (MSQ; SiO:CH3), or amorphous hydrogenated silicon oxycarbide (a-SiOC:H).

In certain embodiments, the low-k dielectric layer 60 may be formed of an organic polymer material having a low dielectric constant. For example, the low-k dielectric layer 60 may be formed of polyallylether resin, cyclic fluoroplastic, siloxane copolymer, polyallylether fluoride resin, polypentafluorostylene, polytetrafluorostylene resin, polyimide fluoride resin, polynaphthalene fluoride, or polycide resin.

The low-k dielectric layer 60 may be formed by a film-forming method having a good gap-fill property (for example, flowable chemical vapor deposition (FCVD) or a spin-on-glass (SOG) coating method). Accordingly, the low-k dielectric layer 60 may be formed on the buffer layer 50 to fill gap regions between the first metal lines 30, and in some embodiments, may have a sufficiently large thickness on the buffer layer 50.

Figure 2E:
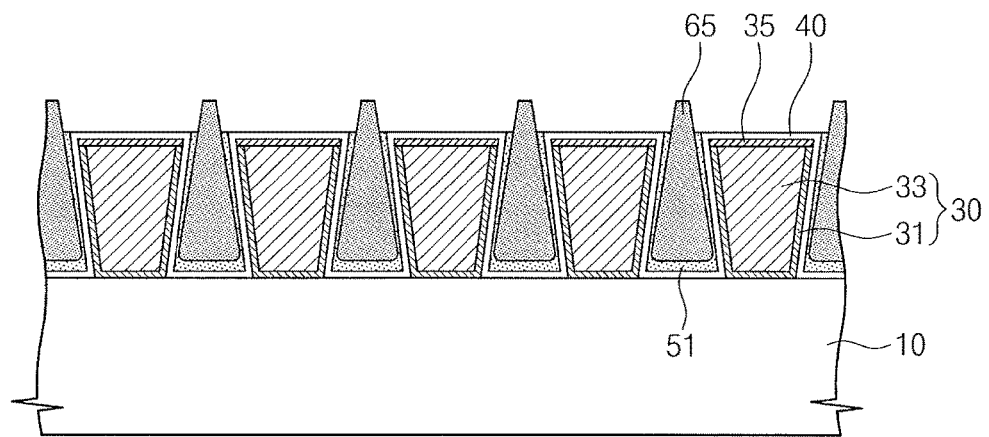

Referring to FIGS. 1 and 2E, a planarization process may be performed on the low-k dielectric layer 60 to expose the buffer layer 50, and thus, low-k dielectric patterns 65 filling the gap regions between the first metal lines 30 may be formed (in S50).

Since the buffer layer 50 is thickly deposited on the top surfaces of the first metal lines 30, top surfaces of the low-k dielectric patterns 65 may be located at a level higher than top surfaces of the first metal lines 30 and the dielectric barrier layer 40, e.g., extend along the first direction D1 further than the first metal lines 30 and the dielectric barrier layer 40. The low-k dielectric patterns 65 may fill gap regions between upper portions of the buffer layer 50. When the planarization process is performed on the low-k dielectric layer 60, the upper portions of the buffer layer 50 may also be planarized.

After the formation of the low-k dielectric patterns 65, the upper portions of the buffer layer 50 may be removed from the top surfaces of the first metal lines 30 (in S60), e.g., such that top surfaces of buffer patterns 51 and the dielectric barrier layer 40 may be coplanar.

The upper portions of the buffer layer 50 may be selectively etched using an etch recipe having an etch selectivity with respect to the low-k dielectric patterns 65 and the dielectric barrier layer 40. Accordingly, the dielectric barrier layer 40 on the top surfaces of the first metal lines 30 and portions of side surfaces of the low-k dielectric patterns 65 may be exposed, and there may be a height difference between the top surfaces of the low-k dielectric patterns 65 and the top surfaces of the first metal lines 30.

In some embodiments, the height difference between the top surfaces of the low-k dielectric patterns 65 and the first metal lines 30 may be dependent on a thickness of the buffer layer 50 on the top surfaces of the first metal lines 30. For example, the height difference between the top surfaces of the low-k dielectric patterns 65 and the first metal lines 30 may range from about 1 nm to about 20 nm.

Furthermore, since the upper portions of the buffer layer 50 are removed, buffer patterns 51, which are portions of the buffer layer 50, may remain under the low-k dielectric patterns 65. The buffer patterns 51 may be locally formed between the first metal lines 30 and may be in direct contact with the low-k dielectric patterns 65. Here, a thickness of the buffer patterns 51 on the bottom surfaces of the low-k dielectric patterns 65 may be different from that on the side surfaces thereof.

Figure 2F:
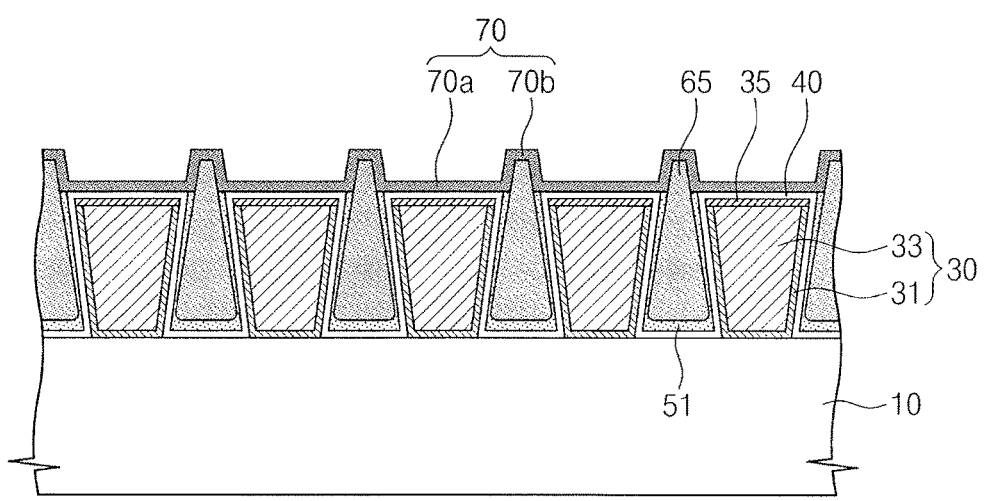

Referring to FIGS. 1 and 2F, an etch stop layer 70 may be formed to conformally cover the dielectric barrier layer 40 on the low-k dielectric patterns 65 and the first metal lines 30 (in S70).

The etch stop layer 70 may be formed of an insulating material having an etch selectivity with respect to the low-k dielectric patterns 65 and may have a substantially uniform thickness on the low-k dielectric patterns 65 and the dielectric barrier layer 40. The etch stop layer 70 may be formed of or include at least one of insulating materials (e.g., SiN, SiON, SiC, SiCN, SiOCH, SiOC, and SiOF). The etch stop layer 70 may be formed by a film-forming method having a good step-coverage or conformal property (for example, CVD or ALD).

In detail, the etch stop layer 70 may include first portions 70a on the top surfaces of the first metal lines 30, and second portions 70b on the low-k dielectric patterns 65, e.g. that cover exposed side surfaces and top surfaces of the low-k dielectric patterns 65. In some embodiments, due to the height difference between the top surfaces of the first metal lines 30 and the low-k dielectric patterns 65, the second portions 70b of the etch stop layer 70 may be located at a level higher than that of the first portions 70a, e.g., may extend along the first direction from the first portions 70a up to top surfaces of the low-k dielectric patterns 65. As an example, the first portions 70a of the etch stop layer 70 may be in direct contact with the dielectric barrier layer 40 covering the top surfaces of the first metal lines 30, and the second portions 70b of the etch stop layer 70 may be in direct contact with the top surfaces and side surfaces of the low-k dielectric patterns 65, as well as with the buffer patterns 51, if present. The first portions 70a and the second portions 70b may be integral and form a single, continuous etch stop layer 70.

Figure 2G:
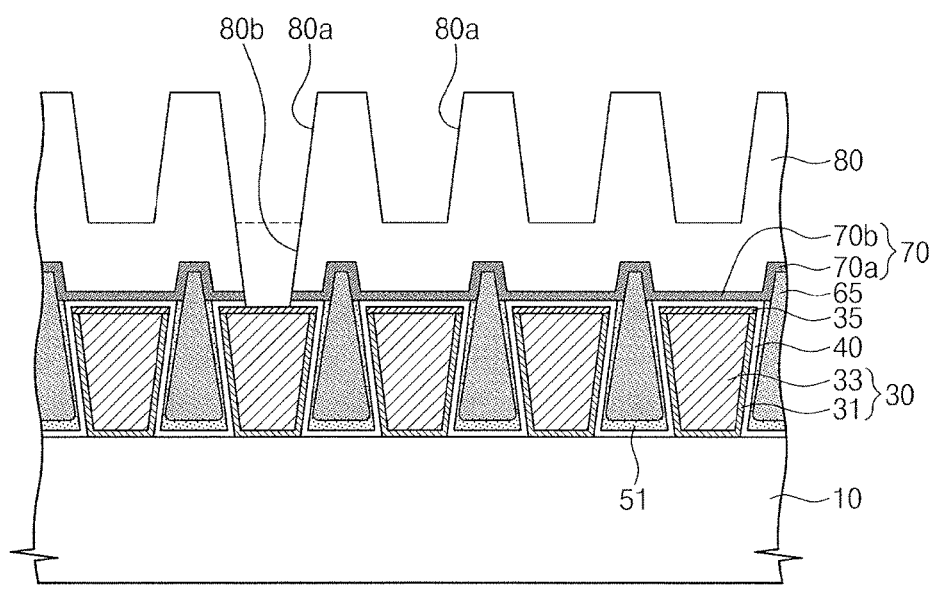

Referring to FIG. 2G, an upper insulating layer 80 may be formed on the etch stop layer 70. The upper insulating layer 80 may be thickly formed on the etch stop layer 70 and may have a flat top surface.

In some embodiments, the upper insulating layer 80 may be formed of a material having a larger dielectric constant than that of the low-k dielectric patterns 65. For example, the low-k dielectric patterns 65 may be formed of a material having a dielectric constant lower than that of silicon oxide and the upper insulating layer 80 may be formed of at least one of silicon oxide based materials. In certain embodiments, the upper insulating layer 80 may also be formed of at least one of low-k dielectric materials having dielectric constants lower than that of silicon oxide.

Next, trenches 80a and via holes 80b may be formed in the upper insulating layer 80. The trenches 80a may be formed to have bottom surfaces spaced apart from the top surfaces of the first metal lines 30 and the etch stop layer 70 along the first direction D1. The via holes 80b may be formed under the bottom surfaces of the trenches 80a to penetrate the upper insulating layer 80, e.g., completely penetrate the upper insulating layer 80.

In detail, the trenches 80a may be formed by etching upper portions of the upper insulating layer 80, and each of the trenches 80a may be formed to have a line shape. The via hole 80b may be formed by further etching a portion of the upper insulating layer 80 overlapping the trench 80a. In certain embodiments, the via holes 80b passing through the upper insulating layer 80 may be firstly formed, and then, the trenches 80a may be formed to be connected to the via holes 80b.

During an etching process for forming the via holes 80b, the upper insulating layer 80, the first portion 70a of the etch stop layer 70, and portions of the dielectric barrier layer 40 may be etched to expose the capping layer 35 on the first metal lines 30. As another example, the via holes 80b may be formed to penetrate the upper insulating layer 80, the etch stop layer 70, the dielectric barrier layer 40, and the capping layer 35 to expose the metal layers 33 of the first metal lines 30.

In some embodiments, the via holes 80b may be formed by an anisotropic etching process. In this case, the low-k dielectric patterns 65 may be protected by the etch stop layer 70. That is, due to the presence of the etch stop layer 70, the low-k dielectric patterns 65 may not be exposed to a subsequent process (e.g., including an etching process). Thus, the low-k dielectric patterns 65 may be prevented from being damaged in the subsequent process. In other words, it may be possible to prevent an effective dielectric constant of the low-k dielectric patterns 65 from being increased by etching damage and thus reduce capacitance between the first metal lines 30. Furthermore, since the top surfaces of the low-k dielectric patterns 65 are higher than the top surfaces of the first metal lines 30 and are protected by the etch stop layer 70, it may be possible to prevent the side surfaces of the first metal lines 30 from being exposed when the via holes 80b are formed.

Figure 2H:
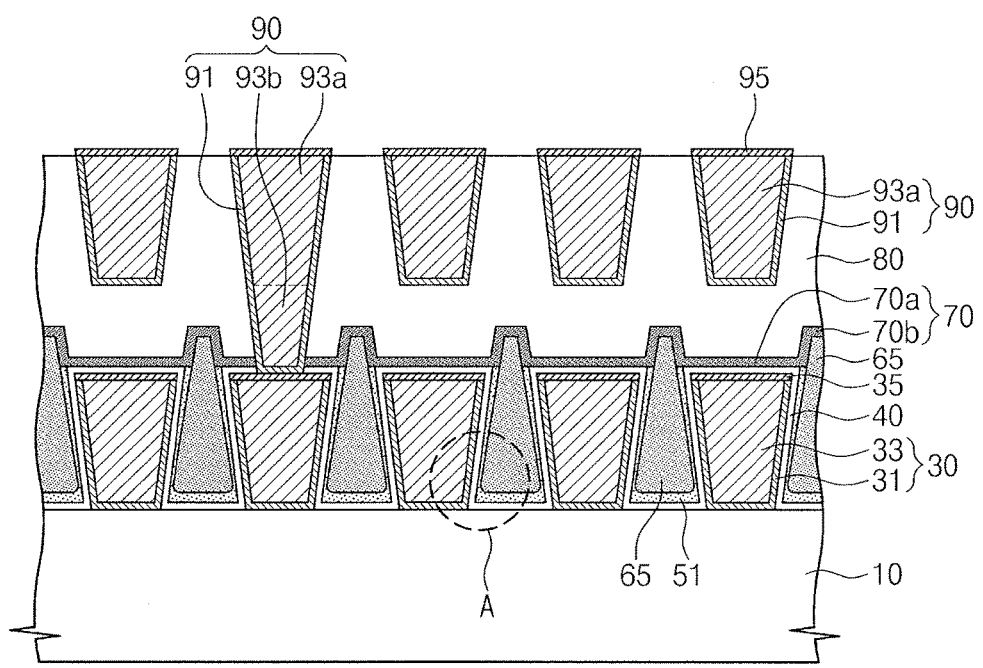

Referring to FIGS. 1 and 2H, second metal lines 90 may be formed in the trenches 80a and the via holes 80b of the upper insulating layer 80 (in S80).

The formation of the second metal lines 90 may include forming a second barrier metal layer 91 to conformally cover the trenches 80a and the via holes 80b, forming a second metal layer 93 on the second barrier metal layer 91 to fill the trenches 80a and the via holes 80b, and planarizing the second barrier metal layer 91 and the second metal layer 93 to expose the top surface of the upper insulating layer 80. In some embodiments, a space between the second metal lines 90 may be substantially the same as that between the first metal lines 30 thereunder.

The second metal layer 93 may include metal lines 93a, which are formed in the trenches 80a, and conductive vias 93b, each of which is formed in the via hole 80b and is connected to a portion of the metal line 93a.

After the formation of the second metal lines 90, an upper capping layer 95 may be formed on top surfaces of the second metal lines 90. The upper capping layer 95 may be formed of a material having an etch selectivity with respect to the upper insulating layer 80. The upper capping layer 95 may be formed of at least one of metals (e.g., Ta, Ru, Co, Mn, Ti, W, Ni, and Al) or nitrides of the metals.

FIGS. 3A and 3B illustrate enlarged sectional views of a portion 'A' of FIG. 2H, As noted above, the buffer patterns 51 may have a non-uniform thickness on the side surfaces of the first metal lines 30, as shown in FIG. 3A. The buffer patterns 51 may also be between the low-k dielectric patterns 65 and the dielectric barrier layer 40. Furthermore, the thickness of the buffer layer 50 may be smaller on the side surfaces of the first metal lines 30 than between the first metal lines 30, e.g., under the low-k dielectric patterns 65. As another example, shown in FIG. 3B, the buffer patterns 51 may not be deposited on at least a portion of the side surfaces of the first metal lines 30, but may remain between the low-k dielectric patterns 65 and the dielectric barrier layer 40.

FIGS. 4A to 4D are sectional views illustrating a method of fabricating a semiconductor device, according to some embodiments. For concise description, an element or step described previously may be identified by a similar or identical reference number without repeating an overlapping description thereof.

Figure 4A:
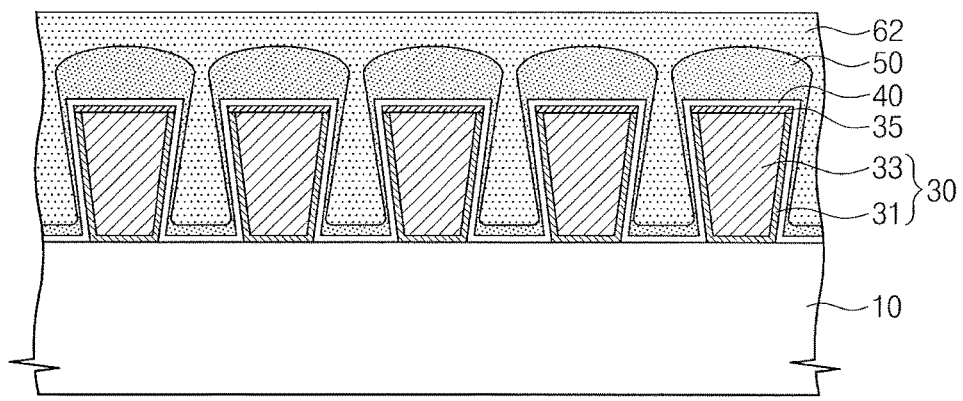
FIGS. 4A to 4D illustrate sectional views of stages in a method of fabricating a semiconductor device, according to some embodiments.

Referring to FIG. 4A, as previously described with reference to FIG. 2C, the dielectric barrier layer 40 and the buffer layer 50 may be formed to cover the first metal lines 30, and then, a sacrificial layer 62 may be formed to fill gap regions between the first metal lines 30.

The sacrificial layer 62 may be formed of or include a material having an etch selectivity with respect to the buffer layer 50. In some embodiments, the sacrificial layer 62 may be a layer made of carbon and hydrogen atoms or a layer made of carbon, hydrogen, and oxygen atoms. For example, the sacrificial layer 62 may be formed of a spin-on-hardmask (SOH) layer or an amorphous carbon layer (ACL). The SOH layer may include a carbon-based SOH layer or a silicon-based SOH layer. As another example, the sacrificial layer 62 may be formed of a photoresist material or amorphous silicon. In the case where a spin coating method is used to form the sacrificial layer 62, the gap regions between the first metal lines 30 may be completely filled with the sacrificial layer 62.

Figure 4B:
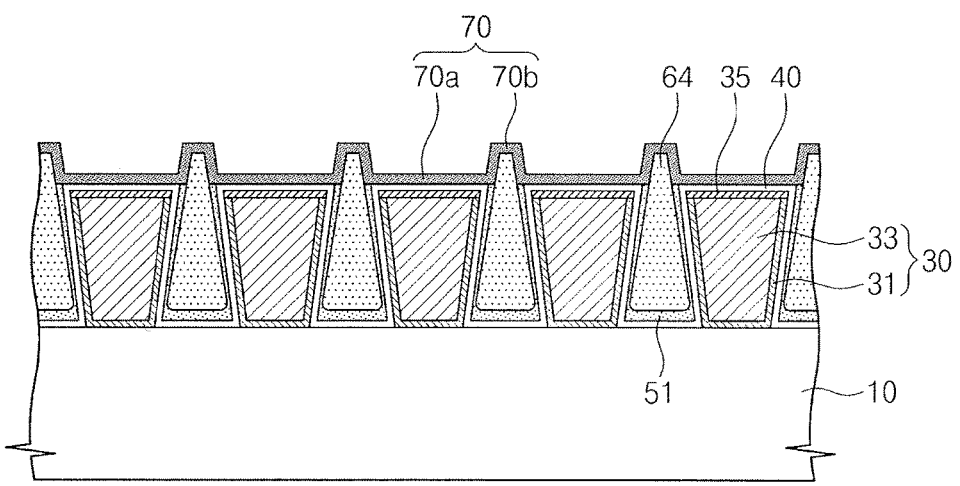

Referring to FIG. 4B, a planarization process may be performed on the sacrificial layer 62 to expose upper portions of the buffer layer 50. Accordingly, sacrificial patterns 64 may be formed between the first metal lines 30.

After the formation of the sacrificial patterns 64, the upper portions of the buffer layer 50 may be selectively etched to expose the dielectric barrier layer 40 on the top surfaces of the first metal lines 30 and portions of side surfaces of the sacrificial patterns 64, as previously described with reference to FIG. 2E.

Next, the etch stop layer 70 may be formed to conformally cover top surfaces of the sacrificial patterns 64 and the first metal lines 30. The etch stop layer 70 may include the first portions 70a that covers the top surfaces of the first metal lines 30 and the second portions 70b that cover top surfaces of the sacrificial patterns 64 and are located at a level higher than the first portions 70a. Furthermore, the first portions 70a of the etch stop layer 70 may be formed to be in direct contact with the dielectric barrier layer 40 on the first metal lines 30, and the second portions 70b of the etch stop layer 70 may be formed to be in direct contact with the sacrificial patterns 64, e.g., exposed side surfaces and top surfaces thereof.

In some embodiments, the etch stop layer 70 may be a porous insulating layer with a plurality of pores. The formation of the porous insulating layer may include forming a carbon-doped silicon oxide layer and performing a thermal treatment process on the carbon-doped silicon oxide layer. The porous insulating layer may be, for example, a SiCOH layer, which a plurality of pores are formed.

Figure 4C:
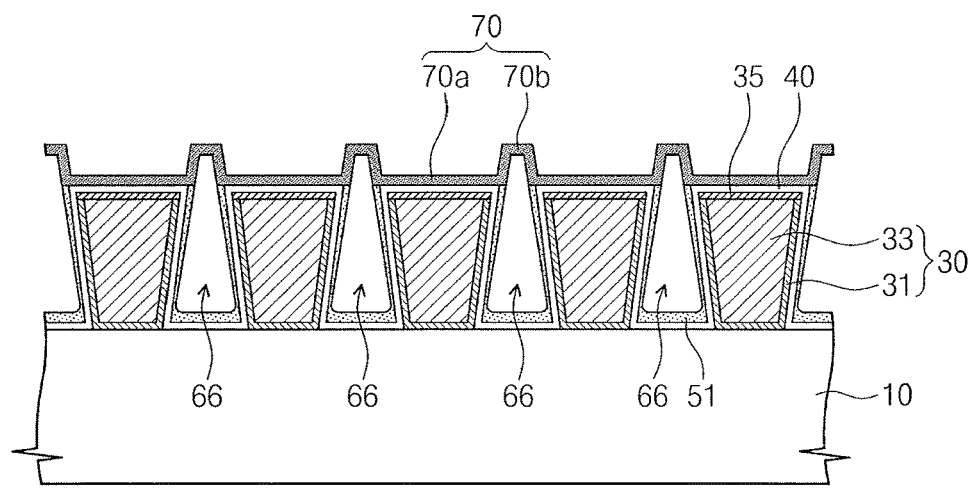

Referring to FIG. 4C, the sacrificial patterns 64 may be removed to form gap regions 66 between the first metal lines 30. In some embodiments, the sacrificial patterns 64 may be removed through the pores in the etch stop layer 70. For example, the sacrificial patterns 64 may be removed by an ashing process using oxygen, ozone, UV or by a wet cleaning process. Accordingly, buffer patterns 51 may be formed on the first metal lines 30, and the gap regions 66 may be defined by the buffer patterns 51 and the etch stop layer 70. Here, the gap regions 66 may be filled with the air having a dielectric constant of about 1.0.

In some embodiments, the gap regions 66 may be defined by the second portion 70b of the etch stop layer 70 and the buffer pattern 51. In the case where, as shown in FIG. 3B, the buffer pattern 51 is partially deposited on the side surfaces of the first metal lines 30, the gap regions 66 may be formed to partially expose the dielectric barrier layer 40.

Since the gap regions 66 are formed between the first metal lines 30 and includes top portions higher than the top surfaces of the first metal lines 30, it may be possible to reduce electric capacitance between the first metal lines 30.

Figure 4D:
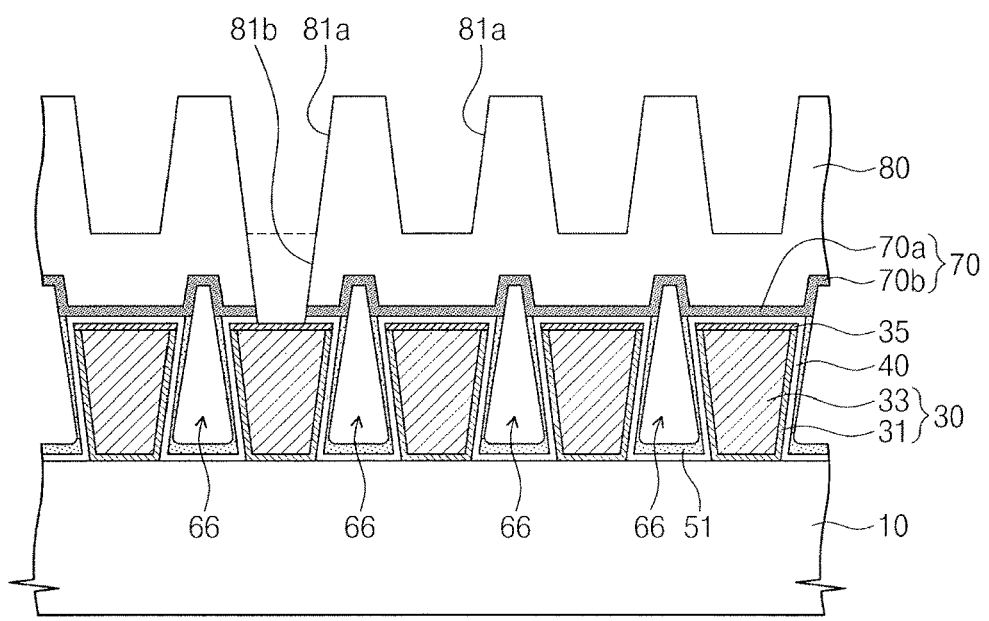

Referring to FIG. 4D, the upper insulating layer 80 may be formed on the etch stop layer 70, after the formation of the gap regions 66.

As described above, a patterning process may be performed on the upper insulating layer 80, and thus, trenches 81a and via holes 81b may be formed. The trenches 81a may be formed to extend in a direction, and the via holes 81b may be formed to penetrate the upper insulating layer 80 and may be connected to the bottom surfaces of the trenches 81a.

In some embodiments, since there is a height difference between two portions of the etch stop layer 70 formed on the first and second portions 70a and 70b it may be possible to prevent the gap regions 66 from being exposed, when the via holes 81b are formed.

Next, the second metal lines 90 may be formed in the trenches 81a and the via holes 81b, as described with reference to FIG. 2H.

FIGS. 5, 6, 7, 8, and 9 are sectional views illustrating semiconductor devices, according to some embodiments. For concise description, an element or step described previously may be identified by a similar or identical reference number without repeating an overlapping description thereof.

Figure 5:
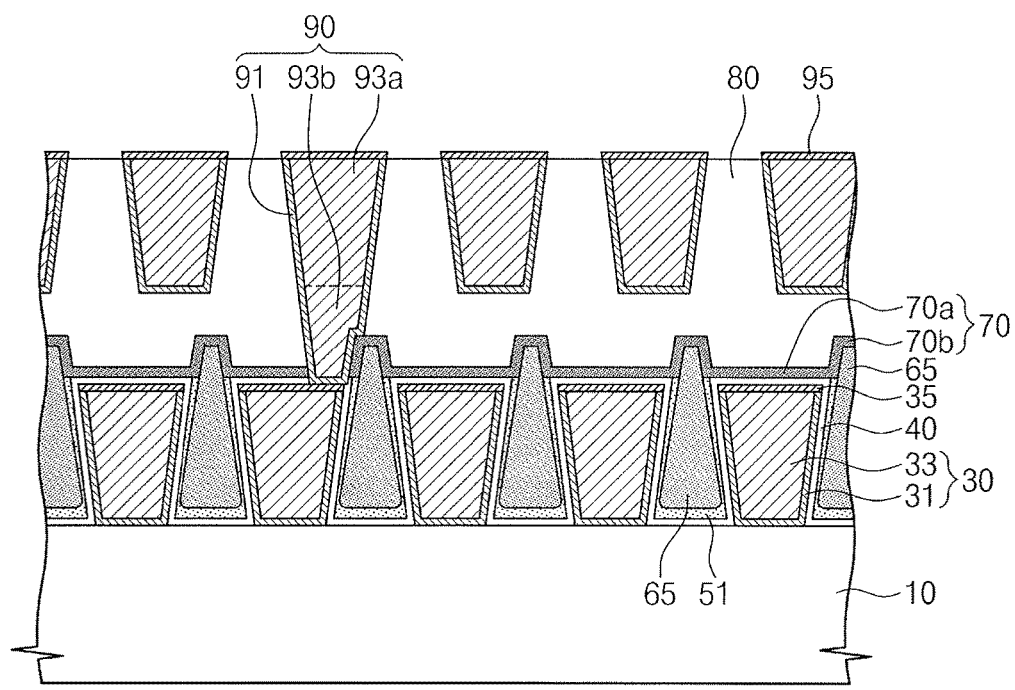
FIGS. 5, 6, 7, 8, and 9 illustrate sectional views of semiconductor devices, according to some embodiments.

In some embodiments shown in FIG. 5, the first metal lines 30 may be spaced apart from each other along the second direction D2 on the lower layer 10, and the second metal lines 90 may be spaced apart from each other along the second direction D2 in the upper insulating layer 80 covering the first metal lines 30, e.g., overlap along the first direction D1.

A space along the second direction D2 between the second metal lines 90 may be substantially the same as that between the first metal lines 30. When viewed in a plan view, the second metal lines 90 may be slightly shifted from the first metal lines 30. In this case, the conductive via 93b of the second metal lines 90 may be formed in a self-aligned manner with respect to the second portion 70b of the etch stop layer 70. For example, the conductive via 93b of the second metal lines 90 may be formed to be adjacent to upper portions of the low-k dielectric patterns 65, e.g., with the etch stop layer 70 there between.

In detail, when the trenches 80a and the via holes 80b are formed in the upper insulating layer 80, the upper portions of the low-k dielectric patterns 65 may be covered with the etch stop layer 70, as described with reference to FIG. 2G, and thus, it may be possible to prevent the side surfaces of the first metal lines 30 from being exposed by the via holes 80b, even when the via holes 80b are adjacent to the low-k dielectric patterns 65.

Figure 6:
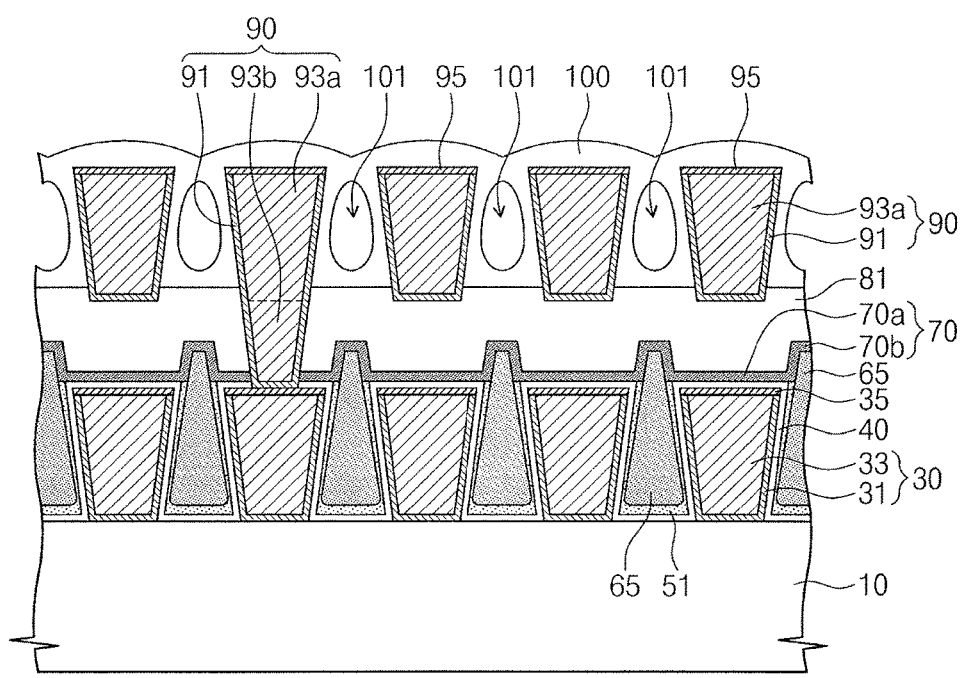

In some embodiments shown in FIG. 6, as described with reference to FIG. 2H, the second metal lines 90 may be formed in the upper insulating layer 80, and then, the upper insulating layer 80 may be recessed to form an upper insulating pattern 81 below the second metal lines 90. The recess of the upper insulating layer 80 may be performed to expose side surfaces of the second metal lines 90. Thereafter, an interlayered insulating layer 100 may be formed to define air gaps 101 between the second metal lines 90. In other words, the air gaps between the second metal lines 90 may be filled with a dielectric material, whose dielectric constant is lower than that of the low-k dielectric patterns 65.

As an example, the interlayered insulating layer 100 may be formed of an insulating material with a poor step-coverage property and by a deposition process with a poor step-coverage property. For example, the interlayered insulating layer 100 may be formed by a physical vapor deposition process. Since the deposition process with a poor step-coverage property is used, the interlayered insulating layer 100 may be deposited to be thicker on the top surfaces of the second metal lines 90 than on the side surfaces of the second metal lines 90. For example, the interlayered insulating layer 100 may form an overhang between the second metal lines 90. Thus, the air gaps 101 may be formed in the interlayered insulating layer 100 and between the second metal lines 90.

Figure 7:
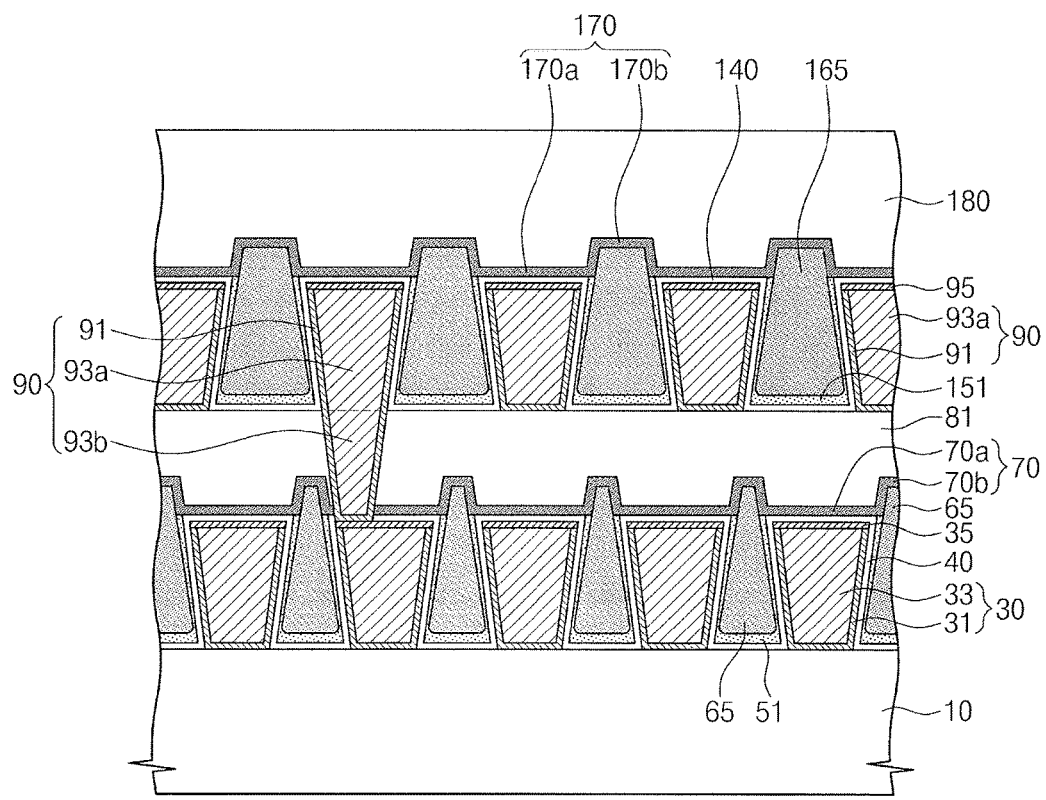

In some embodiments shown in FIG. 7, as described with reference to FIG. 2H, the second metal lines 90 may be formed in the upper insulating layer 80, and then, the upper insulating layer 80 may be recessed to form the upper insulating pattern 81 below the second metal lines 90. The recess of the upper insulating layer 80 may be performed to expose the side surfaces of the second metal lines 90.

Similar to the dielectric barrier layer 40 described with reference to FIG. 2B, an upper dielectric barrier layer 140 may be formed to conformally cover the second metal lines 90, after the process of exposing the side surfaces of the second metal lines 90.

Next, similar to the previous embodiments of FIGS. 2C to 2F, upper buffer patterns 151 and upper low-k dielectric patterns 165 may be formed between the second metal lines 90. Here, the formation of the upper buffer patterns 151 and the upper low-k dielectric patterns 165 may be performed using the same method as that for forming the buffer patterns 51 and the low-k dielectric patterns 65.

Widths of the upper low-k dielectric patterns 165 may be changed, depending on spaces between the second metal lines 90. In some embodiments, the spaces between the second metal lines 90 may be larger than those between the first metal lines 30 and the widths of the upper low-k dielectric patterns 165 may be larger than those of the low-k dielectric patterns 65.

Thereafter, an upper etch stop layer 170 and an interlayered insulating layer 180 may be sequentially formed on top surfaces of the upper low-k dielectric patterns 165 and the second metal lines 90. Here, similar to the etch stop layer 70 provided on the first metal lines 30, the upper etch stop layer 170 may include first portions 170a and second portions 170b, which are located at different levels.

Figure 8:
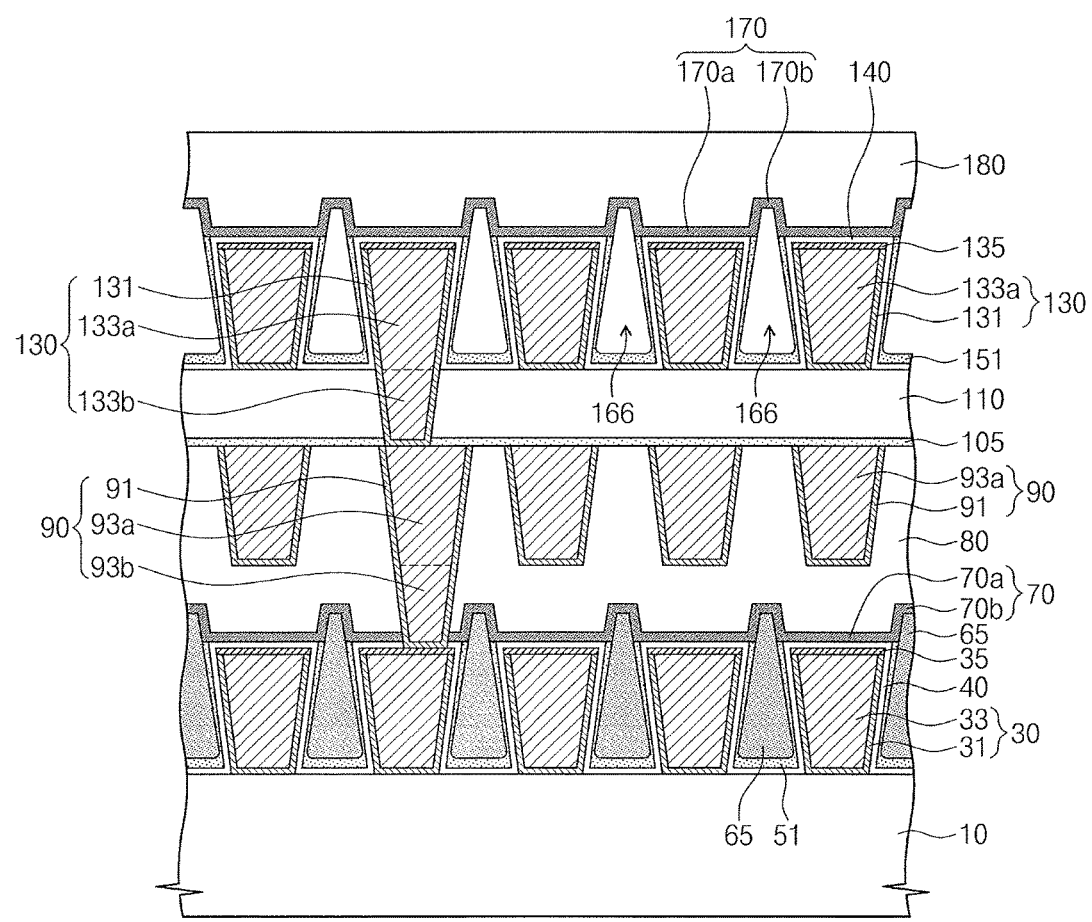

In some embodiments shown in FIG. 8, after the formation of the second metal lines 90, an insulating layer 110 may be further formed on the upper insulating layer 80, and a metal diffusion barrier layer 105 may be formed between the insulating layer 110 and the second metal lines 90.

In some embodiments, third metal lines 130 may be formed on the insulating layer 110. At least one of the third metal lines 130 may be electrically connected to the second metal lines 90. Each of the third metal lines 130 may include a third metal barrier layer 131 and a third metal layer 133, and the third metal layer 133 may include a metal line 133a, which is provided to extend in a direction, and a conductive via 133*b*, which is connected to a portion of the metal line 133*a*.

In some embodiments, upper gap regions 166 may be formed between the third metal lines 130, similar to the embodiments of FIGS. 4A to 4D. In certain embodiments, the low-k dielectric patterns 65 may be formed between the third metal lines 130, similar to the embodiments of FIGS. 2B to 2F.

Figure 9:
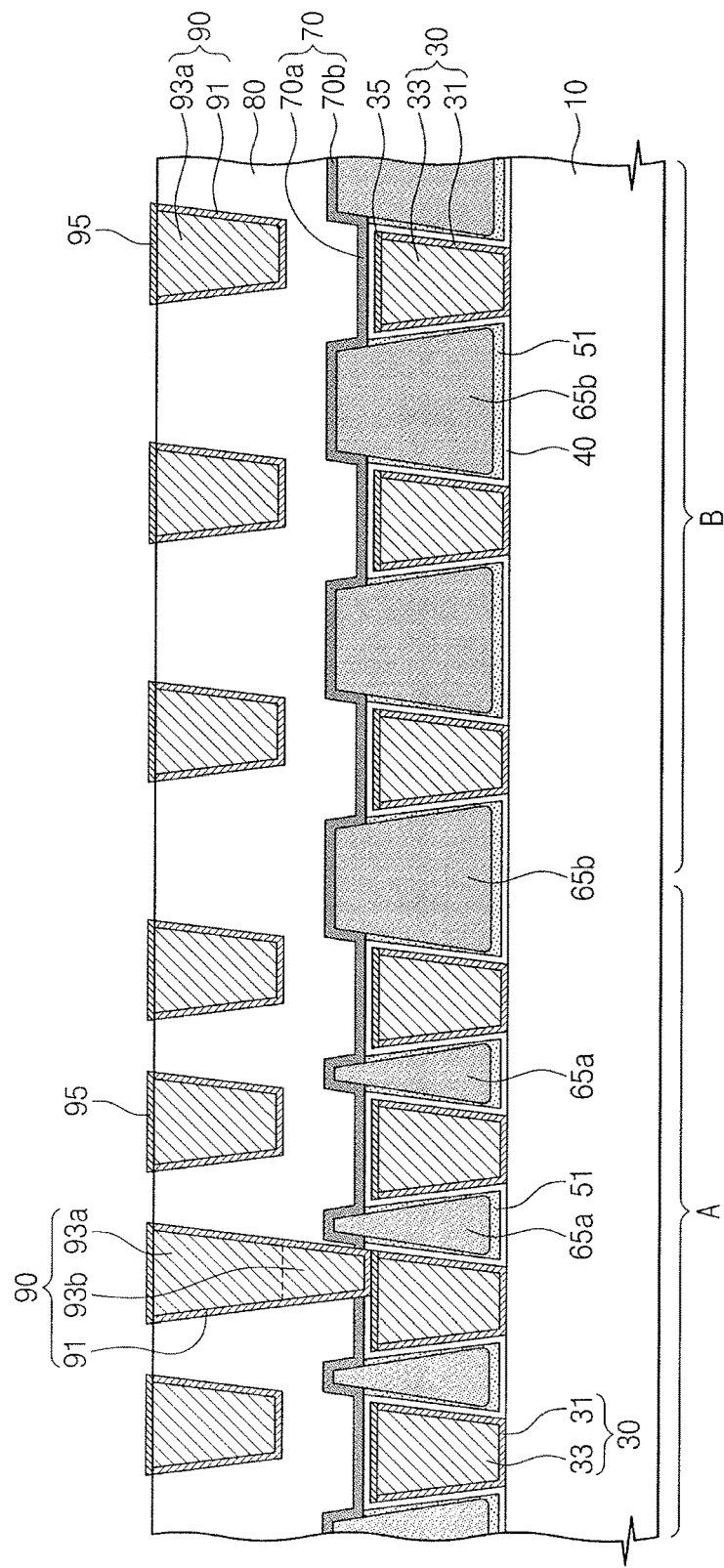

In some embodiments shown in FIG. 9, the lower layer 10 may include a first region A with a high density of the first metal lines 30 and a second region B having a low density of the first metal lines 30. For example, the first metal lines 30 may be spaced apart from each other along the second direction D2 by a first space on the first region A and by a second space, which is larger than the first space, on the second region B. As an example, a width of the first metal lines 30 on the first region A may be substantially the same as that on the second region B, but embodiments are not limited thereto. For example, a width of the first metal lines 30 on the first region A may be different from that on the second region B.

First low-k dielectric patterns 65*a* may be provided between the first metal lines 30 on the first region A, and second low-k dielectric patterns 65*b* may be provided between the first metal lines 30 on the second region B. Each of the first and second low-k dielectric patterns 65*a* and 65*b* may have a decreasing width in a direction from its bottom surface to its top surface, and an upper width of the first low-k dielectric patterns 65*a* may be smaller than an upper width of the second low-k dielectric patterns 65*b*.

Similar to the embodiments of FIGS. 2A to 2G, the first and second low-k dielectric patterns 65*a* and 65*b* may be formed between the first metal lines 30 on the first and second regions A and B, after the formation of the buffer patterns 51. For example, the first and second low-k dielectric patterns 65*a* and 65*b* may have top surfaces which are located at a level higher than that of the top surfaces of the first metal lines 30.

The etch stop layer 70 may be formed on the first and second regions A and B to conformally cover top surfaces of the first metal lines 30 and the first and second low-k dielectric patterns 65*a* and 65*b*. The upper insulating layer 80 may be formed on the etch stop layer 70, and the second metal lines 90 may be formed in the upper insulating layer 80.

The conductive via 93*b* of the second metal lines 90 may be provided to penetrate the upper insulating layer 80, the first portion 70*a* of the etch stop layer 70, and the dielectric barrier layer 40 and may be coupled to one of the first metal lines 30.

According to some embodiments, it may be possible to realize a difference in height between top surfaces of metal lines and low-k dielectric patterns, even when a process of recessing the metal lines is omitted. This may make it possible to prevent the low-k dielectric patterns from being contaminated by a metallic material or from being damaged by a recess process. Furthermore, after a process of forming the metal lines, a low-k dielectric material may be formed to fill a gap region between the metal lines. Thus, it may be possible to prevent the low-k dielectric patterns from being damaged when a process of filling the gap region is performed. This may make it possible to reduce electric capacitance between the metal lines and consequently to increase an operating speed of a semiconductor device. Protruding portions of the low-k dielectric patterns may be covered with an etch stop layer, and thus, it may be possible to prevent side surfaces of the low-k dielectric patterns from being exposed, when an etching process is performed to form via holes exposing top surfaces of the metal lines.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   first metal lines on a lower layer;
   a dielectric barrier layer on the lower layer to cover side and top surfaces of the first metal lines;
   an etch stop layer on the dielectric barrier layer to define gap regions between the first metal lines, the etch stop layer including first portions on the top surfaces of the first metal lines and second portions between the first metal lines;
   an upper insulating layer on the etch stop layer; and
   a conductive via that penetrates the upper insulating layer, the etch stop layer, and the dielectric barrier layer to contact a top surface of a first metal line,
   wherein upper surfaces, facing away from the lower layer, of the second portions of the etch stop layer are located at a level higher than upper surfaces, facing away from the lower layer, of the first portions of the etch stop layer.

2. The semiconductor device as claimed in claim 1, wherein first portions of the etch stop layer are in direct contact with the dielectric barrier layer.

3. The semiconductor device as claimed in claim 1, wherein the first and second portions of the etch stop layer have substantially the same thickness.

4. The semiconductor device as claimed in claim 1, wherein the gap regions have a decreasing width in a direction from bottom surfaces of the first metal lines to the top surfaces of the first metal lines.

5. The semiconductor device as claimed in claim 1, wherein the first metal lines have an upper width larger than that of the gap regions.

6. The semiconductor device as claimed in claim 1, wherein the dielectric barrier layer has a substantially uniform thickness on the side and top surfaces of the first metal lines.

7. The semiconductor device as claimed in claim 1, further comprising buffer patterns between the first metal lines and on the dielectric barrier layer and spaced apart from the second portions of the etch stop layer,
   wherein the buffer patterns are formed of a dielectric material different from the dielectric barrier layer.

8. The semiconductor device as claimed in claim 7, wherein:
   the buffer patterns includes a portion extending along the side surfaces of the first metal lines, and
   a thickness of the buffer patterns on the side surfaces of the first metal lines is smaller than that on the lower layer.

9. The semiconductor device as claimed in claim 1, wherein the gap regions are filled with air.

10. The semiconductor device as claimed in claim 1, further comprising low-k dielectric patterns filling the gap regions, the low-k dielectric patterns having a dielectric constant lower than that of the dielectric barrier layer.

11. The semiconductor device as claimed in claim 10, wherein the low-k dielectric patterns have top surfaces at a level higher than the top surfaces of the first metal lines.

12. A semiconductor device, comprising:
   first metal lines on a lower layer;
   low-k dielectric patterns to fill gap regions between the first metal lines and having top surfaces located at a level higher than top surfaces of the first metal lines, the low-k dielectric patterns being spaced apart from each other;
   buffer patterns between the first metal lines and between bottom surfaces of the low-k dielectric patterns and the lower layer, the buffer patterns being formed of an insulating material different from that of the low-k dielectric patterns;
   an etch stop layer that covers the top surfaces of the first metal lines and the low-k dielectric patterns;
   an upper insulating layer on the etch stop layer, the upper insulating layer filling spaces between the low-k dielectric patterns; and
   a conductive via that penetrates the upper insulating layer and the etch stop layer, and is in contact with a top surface of a first metal line.

13. The semiconductor device as claimed in claim 12, wherein the buffer patterns includes portions interposed between side surfaces of the first metal lines and the low-k dielectric patterns, and
   the buffer patterns on the side surfaces of the first metal lines have a thickness different from that on the lower layer.

14. The semiconductor device as claimed in claim 12, wherein the first metal lines have an upper width larger than that of the low-k dielectric patterns.

15. The semiconductor device as claimed in claim 12, wherein the low-k dielectric patterns have an upper width that is smaller than a lower width thereof.

16. A semiconductor device, comprising:
   first metal lines on a lower layer, the first metal lines extending in a first direction and are spaced apart along a second direction, different from the first direction;
   a dielectric barrier layer on the lower layer to cover side and top surfaces of the first metal lines;
   an etch stop layer on the dielectric barrier layer to define gap regions between the first metal lines, the etch stop layer including first portions on the top surfaces of the first metal lines and second portions between the first metal lines, the second portions extending from upper surfaces of the first portions along the first direction away from the lower layer;
   an upper insulating layer on the etch stop layer; and
   a conductive via that penetrates the upper insulating layer, the etch stop layer, and the dielectric barrier layer to contact a top surface of a first metal line.

17. The semiconductor device as claimed in claim 16, further comprising low-k dielectric patterns filling the gap regions, the low-k dielectric patterns having a dielectric constant lower than that of the dielectric barrier layer.

18. The semiconductor device as claimed in claim 17, wherein the low-k dielectric patterns have top surfaces at a level higher than top surfaces of the dielectric barrier layer.

19. The semiconductor device as claimed in claim 17, wherein the low-k dielectric patterns are air.

20. The semiconductor device as claimed in claim 17, wherein top surfaces of the first metal lines are wider than top surfaces of the low-k dielectric patterns.

* * * * *